United States Patent
Dvinelis et al.

(10) Patent No.: US 11,973,319 B2
(45) Date of Patent: Apr. 30, 2024

(54) RADIANT BEAM COMBINING OF MULTIPLE MULTIMODE SEMICONDUCTOR LASER DIODES FOR DIRECTIONAL LASER BEAM DELIVERY APPLICATIONS

(71) Applicant: UAB BROLIS SEMICONDUCTORS, Vilnius (LT)

(72) Inventors: Edgaras Dvinelis, Vilnius (LT); Augustinas Vizbaras, Vilnius (LT); Kristijonas Vizbaras, Vilnius (LT)

(73) Assignee: UAB Brolis Semiconductors, Vilnius (LT)

(*) Notice: Subject to any disclaimer, the term of this patent is extended or adjusted under 35 U.S.C. 154(b) by 448 days.

(21) Appl. No.: 16/764,631

(22) PCT Filed: Nov. 15, 2018

(86) PCT No.: PCT/EP2018/081380
§ 371 (c)(1),
(2) Date: May 15, 2020

(87) PCT Pub. No.: WO2019/096910
PCT Pub. Date: May 23, 2019

(65) Prior Publication Data
US 2020/0403382 A1 Dec. 24, 2020

Related U.S. Application Data

(60) Provisional application No. 62/587,690, filed on Nov. 17, 2017.

(51) Int. Cl.
*H01S 5/40* (2006.01)
*G01S 7/495* (2006.01)
(Continued)

(52) U.S. Cl.
CPC ............ *H01S 5/4012* (2013.01); *G01S 7/495* (2013.01); *G02B 27/0905* (2013.01); *G02B 27/0922* (2013.01); *H01S 5/0071* (2013.01)

(58) Field of Classification Search
CPC . G01S 7/495; G02B 27/0905; G02B 27/0922; G02B 27/0927; G02B 27/30;
(Continued)

(56) References Cited

U.S. PATENT DOCUMENTS

| 4,009,965 A | 3/1977 | Pryor |
| 5,033,043 A | 7/1991 | Hayakawa |

(Continued)

FOREIGN PATENT DOCUMENTS

| CN | 1299167 A | 6/2001 |
| CN | 101055429 A | 10/2007 |

(Continued)

OTHER PUBLICATIONS

Dvinelis et al., "Band I DIRCM laser based on GaSb direct diode technology" Proceedings vol. 10637, Laser Technology for Defense and Security XIV; 106370B (2018) https://doi.org/10.1117/12.2304619, 6 pages.

(Continued)

*Primary Examiner* — Joseph P Martinez
*Assistant Examiner* — Vipin Patel
(74) *Attorney, Agent, or Firm* — Goodwin Procter LLP

(57) ABSTRACT

A method and apparatus for beam combining for multiple multimode semiconductor laser diodes includes achieving beam combining in radiant space to provide a directional laser beam with a uniform high radiant intensity level distribution over a large area at a long distance from the source. The method uses more than one broad area high-power multimode semiconductor laser diode and individual optics for collimation, and includes combining the beams of (Continued)

these emitters to provide a relatively homogeneous radiant intensity beam at a long distance for applications such as directed energy delivery, free-space laser communication, and directional infrared countermeasures.

21 Claims, 8 Drawing Sheets

(51) Int. Cl.
    *G02B 27/09*     (2006.01)
    *H01S 5/00*     (2006.01)

(58) Field of Classification Search
    CPC .............. H01S 2301/206; H01S 5/0071; H01S 5/2036; H01S 5/4012; H01S 5/405; H01S 5/4087; H01S 5/02325
    See application file for complete search history.

(56) References Cited

U.S. PATENT DOCUMENTS

| | | | |
|---|---|---|---|
| 5,566,195 | A | 10/1996 | Heppner et al. |
| 5,610,733 | A | 3/1997 | Feldman et al. |
| 5,757,839 | A | 5/1998 | Biswal et al. |
| 5,793,783 | A | 8/1998 | Endriz |
| 5,825,552 | A | 10/1998 | Kurtz et al. |
| 6,064,528 | A | 5/2000 | Simpson, Jr. |
| 6,144,791 | A | 11/2000 | Wach et al. |
| 6,167,016 | A | 12/2000 | Block et al. |
| 6,582,875 | B1 | 6/2003 | Kay et al. |
| 6,714,568 | B2 | 3/2004 | Hunt |
| 6,853,490 | B2 | 2/2005 | Wang et al. |
| 6,901,221 | B1 | 5/2005 | Jiang et al. |
| 6,971,578 | B2 | 12/2005 | Tsikos |
| 6,975,458 | B1 | 12/2005 | Kanzler |
| 7,046,187 | B2 | 5/2006 | Fullerton et al. |
| 7,085,304 | B2 | 8/2006 | Vetrovec |
| 7,429,734 | B1 | 9/2008 | Tidwell |
| 7,554,737 | B2 | 6/2009 | Knox et al. |
| 7,729,574 | B2 | 6/2010 | Moriarty |
| 7,970,040 | B1 | 6/2011 | Sprangle et al. |
| 8,215,776 | B2 | 7/2012 | Kessler et al. |
| 8,334,490 | B2 | 12/2012 | Schaub et al. |
| 8,502,976 | B2 | 8/2013 | Sharpe et al. |
| 8,767,790 | B2 | 7/2014 | Sipes, Jr. |
| 8,792,978 | B2 | 7/2014 | Wells et al. |
| RE45,177 | E | 10/2014 | Galvanauskas et al. |
| 8,909,017 | B2 | 12/2014 | Jasapara |
| 9,001,172 | B2 | 4/2015 | Ghauri |
| 9,031,113 | B2 | 5/2015 | Litvin et al. |
| 9,093,822 | B1* | 7/2015 | Chann ................... H01S 5/4062 |
| 9,147,990 | B2 | 9/2015 | Dueck |
| 9,366,872 | B2 | 6/2016 | Honea et al. |
| 9,554,124 | B1 | 1/2017 | Owurowa et al. |
| 9,726,818 | B1 | 8/2017 | Yap et al. |
| 2001/0040214 | A1 | 11/2001 | Friedman et al. |
| 2003/0063391 | A1* | 4/2003 | Wang ....................... B41J 2/451 359/619 |
| 2004/0165268 | A1* | 8/2004 | Turunen ............. G02B 27/0927 359/558 |
| 2005/0062638 | A1 | 3/2005 | Zeineh |
| 2005/0147135 | A1 | 7/2005 | Kurtz et al. |
| 2008/0062242 | A1 | 3/2008 | Van Brocklin et al. |
| 2009/0231580 | A1 | 9/2009 | Nagy et al. |
| 2011/0157706 | A1* | 6/2011 | Mitra ................. G02B 27/0927 359/639 |
| 2012/0081893 | A1 | 4/2012 | Faybishenko |
| 2012/0213513 | A1 | 8/2012 | Chao |
| 2013/0148684 | A1 | 6/2013 | Guo et al. |
| 2015/0003484 | A1 | 1/2015 | Muendel |
| 2015/0277128 | A1 | 10/2015 | Johnson |
| 2016/0380410 | A1 | 12/2016 | Song |
| 2017/0189992 | A1 | 7/2017 | Dittli et al. |

FOREIGN PATENT DOCUMENTS

| | | |
|---|---|---|
| CN | 100440538 C | 12/2008 |
| CN | 103180241 A | 6/2013 |
| CN | 105612620 A | 5/2016 |
| DE | 102010045620 A1 | 3/2012 |
| DE | 112015001710 T5 | 1/2017 |
| EP | 1883824 A2 | 2/2008 |
| WO | WO-2002/50599 A1 | 6/2002 |
| WO | WO-2007/070080 A2 | 6/2007 |
| WO | WO-2014/125116 A1 | 8/2014 |
| WO | WO-2017/097923 A1 | 6/2017 |

OTHER PUBLICATIONS

Dvinelis et al., "Next generation DIRCM for 2/1-2/3 micron wavelength based on direct-diode GaSb technology", Proc. SPIE 10514, High-Power Diode Laser Technology XVI, 1051405, (Feb. 19, 2018) https://doi.org//10.1117/12.2289425, 7 pages.

International Search Report for International Patent Application No. PCT/EP2018/081380, dated Mar. 1, 2019, 4 pages.

Written Opinion for International Patent Application No. PCT/EP2018/081380, dated Mar. 1, 2019, 6 pages.

* cited by examiner

RADIANT BEAM COMBINING OF MULTIPLE MULTIMODE SEMICONDUCTOR LASER DIODES FOR DIRECTIONAL LASER BEAM DELIVERY APPLICATIONS

RELATED APPLICATION

This application is a U.S. National Stage Application filed under 35 U.S.C. § 371 of International Patent Application No. PCT/EP2018/081380, filed Nov. 15, 2018, which claims priority to and the benefit of U.S. Provisional Patent Application No. 62/581,981, filed Nov. 17, 2017, the contents of which are incorporated herein by reference in their entireties.

FIELD OF THE INVENTION

Embodiments of this invention relate to beam combining of high-power broad area multimode semiconductor laser diodes in radiant space for long-distance directional laser energy applications such as directional infrared countermeasures and secure free-space communication, in which it is essential to maintain hole-free radiant intensity distribution across a large area.

BACKGROUND

Directional laser energy delivery systems for applications such as free space communications and directional infrared countermeasures (DIRCM) typically require laser beam delivery over long distances, i.e., a few to tens of kilometers, over which high radiant intensity needs to be maintained within a certain solid angle corresponding to a cross-sectional beam area of several square meters.

For such large cross-section areas, it is important that the high radiant intensity level variation within this area be as homogeneous as possible. More importantly, the radiant intensity level is preferably not lower than a certain minimal value that is defined by the particular application. Typically, this requirement is met by using low beam parameter laser sources such as single-spatial mode semiconductor laser diodes, solid state lasers or fibers lasers, given they provide sufficient output power to meet the radiant intensity requirement of the application. For certain applications such as DIRCM—in which a laser source is used to jam the seeker of the missile—one needs to use a plurality of laser sources to cover a wide spectral band of the seeker detector (typically, but not limited to, InSb) which is guided by detecting and locking to a specific spectral signature of the aircraft. To provide adequate protection for airborne platforms, modern DIRCM systems need to counter the threat at long distances (typically a few kilometers). Accordingly, such systems need to be able to provide a jamming signal of sufficiently high radiant intensity (i.e., orders of magnitude higher than the thermal signature of the platform itself) with high directionality. See David H. Titterton, "Military Laser Technology and Systems", ISBN: 9781608077786, 2015, including pages 288-293, incorporated herein in its entirety and cited in part below:

> As is necessary with other countermeasure techniques, the brightness (or radiant intensity) of the thermal jamming source needs to get the attention of the homing head in the heat-seeking missile (i.e., present a more attractive source of thermal energy to the seeker than the platform that is being attacked). This is achieved by ensuring the radiant intensity of the jammer exceeds the radiant intensity of the platform it is protecting by a significant factor, usually by at least 10, often an order of magnitude more. This relationship is known as the jam-to-signal ratio (or J:S).

A thermal signature of a typical airborne platform has distinct features across several spectral bands related to the thermal emissivity of hot metal and jet plume of the engine. Therefore, modern DIRCM systems combine more than one laser source emitting at different spectral bands in order to be able to mimic these thermal signatures. An ideal airborne DIRCM system is as small as possible due to strict airborne payload requirements and is as efficient as possible.

The most efficient laser type for this application is based on semiconductor laser technology, which offers unmatched performance and compactness, when it is available. Until recently, semiconductor lasers of sufficient performance for DIRCM application have been available only in the 0.8-1.5 micron spectral band and 3-5 micron spectral band, leaving an uncovered atmospheric transmission window in the 2.1-2.3 micron range. This window is typically covered using either a solid-state laser or fiber laser technology involving multiple pumping cascade schemes—e.g., a diode laser pump at 790 nm, pumping a Tm doped fiber, which in turn pumps Ho doped fiber. See G. Frith, et al., "Latest developments in 790 nm-pumped Tm-doped fibre laser systems for DIRCM applications," Proc. Of SPIE Vol. 7115, 2008.; Ian Elder, "Thulium fibre laser pumped mid-IR source," Proc. Of SPIE Vol. 7325, 2009; and H. D. Tholl, "Mid-infrared Semiconductor Lasers for Power Projection and Sensing", Proc. Of SPIE Vol. 7836, 2010, incorporated herein in their entireties. This leads to a very bulky laser setup with a footprint 100 times bigger than a typical semiconductor laser, thereby compromising overall DIRCM system potential and usability.

Semiconductor laser diodes in the 2.1-2.3 micron spectral region have been available for years. See A. Vizbaras et al., "High-performance single-spatial mode GaSb type-I laser diodes around 2.1 micron," Proc. of SPIE, Vol. 8993, 2014; and M. C. Kelemen et al., "Diode laser systems for 1.8 to 2.3 µm wavelength range," Proc. of SPIE Vol. 7686, 2010, incorporated herein in their entireties. However, the output power of available single mode laser diode emitters is not sufficient for long distance laser delivery applications, and multimode emitters alone do not provide sufficient radiant intensity due to poor beam quality.

SUMMARY

In an embodiment of the invention, a method includes combining the output of multiple multimode laser diode emitters in radiant space so that the radiant intensity of the combined beam within a particular selected solid angle is sufficient for directional long distance laser delivery applications such as DIRCM or free-space communications. This allows complete coverage of the spectral response window of the missile seeker with only semiconductor laser sources, providing radical reduction in overall systems size, efficiency, and cost.

In an aspect, embodiments of the invention relate to a method of combining a plurality of multimode laser beams in radiant space. The method includes the step of providing a plurality of laser beam emitters for generating the plurality of multimode laser beams. An individual multimode laser beam from each emitter is steered to partially overlap with at least one other multimode laser beam to form a combined beam with a homogeneous non-Gaussian radiant intensity distribution across a selected solid angle.

One or more of the following features may be included. Each laser beam emitter may include a broad area semiconductor laser with a multimode beam output. The laser beam emitters may be spatially separated from each other to define at least one of a one-dimensional array or a two-dimensional array.

Individual beam collimation optics may be provided for each laser beam emitter. The collimation optics may be a cylindrical lens, an aspheric lens, an aspheric cylinder lens, a spherical lens, a toroidal lens, a gradient-index lens, and/or a combination thereof. The collimation optics may be discrete, arranged in a monolithic one-dimensional array, and/or arranged in a two-dimensional array.

The laser beam emitter may include a laser diode, and the individual multimode laser beam may be steered from the emitter at a desired angle in radiant space by individually offsetting a position of the respective collimation optics with reference to an output plane of the laser diode.

The laser beam emitter may include a laser diode, and the individual multimode laser beam may be steered from the emitter by offsetting a position of the laser diode with respect to an optical axis of the respective beam collimation optics.

The laser beam emitter may include a laser diode, and beam combining may be performed without any offset between the laser diode and the respective collimation optics, and beam steering is performed by steering the laser diode and the respective collimation optics.

Steering the individual laser beam may include using an external optical element. The external optical element may be, e.g., optical mirrors, optical prisms, optical wedge pairs, optical beam splitters, optical dichroic mirrors, and/or combinations thereof.

In another aspect, embodiments of the invention relate to a laser-based assembly for combining a plurality of multimode laser beams in radiant space. The assembly includes a plurality of laser beam emitters, and a plurality of individual beam collimation optics, with one individual beam collimation optics being associated with each emitter. The laser beam emitters and collimation optics are spaced and arranged such that, in use, individual multimode laser beams from each emitter cooperate and overlap with at least one other multimode laser beam to form a combined beam with a homogeneous non-Gaussian radiant intensity distribution across a selected solid angle One or more of the following features may be included independently of the other features. These features and preferred features may apply to each of the various aspects of the invention described herein.

Each laser beam emitter may include a broad area semiconductor laser with a multimode beam output.

Individual pairs of laser beam emitters and the respective collimation optics may be spatially separated to define at least one of a one-dimensional array or a two-dimensional array.

The collimation optics may include a cylindrical lens, an aspheric lens, an aspheric cylinder lens, a spherical lens, a toroidal, a gradient-index lens, and/or or a combination thereof.

Each laser beam emitter may include a laser diode. In use, the individual multimode laser beams from the emitters may each be steered at a desired angle in radiant space by individually offsetting a position of the individual beam collimation optics with reference to an output plane of the laser diode of the associated laser beam emitter. In use, the individual multimode laser beam from the emitters may each be steered by offsetting a position of the laser diode with respect to an optical axis of the respective beam collimation optics.

Individual pairs of laser beam emitters and the respective collimation optics may be adapted and arranged to be steered to form the combined beam.

The laser-based assembly may further include a plurality of external optical elements spaced and arranged to steer the individual laser beams. The external optical elements may be optical mirrors, optical prisms, optical wedge pairs, optical beam splitters and optical dichroic mirrors, and/or combinations thereof.

In yet another aspect, embodiments of the invention relate to multi-spectral laser beam delivery system including at least two laser modules. Each laser module includes a laser-based assembly for combining a plurality of multimode laser beams in radiant space and includes a plurality of laser beam emitters and a plurality of individual beam collimation optics, with one individual beam collimation optics being associated with each emitter. The laser beam emitters and collimation optics are spaced and arranged such that, in use, individual multimode laser beams from each emitter cooperate and partially overlap to form a combined beam with a homogeneous non-Gaussian radiant intensity distribution across a selected solid angle. Each of the laser modules emits at a different spectral region selected from the group consisting of ultraviolet, infrared, near-infrared, short-wave infrared, mid-infrared and long-wave infrared, to provide a multispectral, radiantly combined laser beam at an output of the system.

DETAILED DESCRIPTION

Embodiments of this invention include using more than one spatially separated broad area multimode semiconductor laser diode, individual collimation optics, and combined output in radiant space with overlapping individual beams to form one combined beam characterized by a homogeneous radiant intensity distribution within a certain given divergence cone, typically a few mrads.

Figure 1:
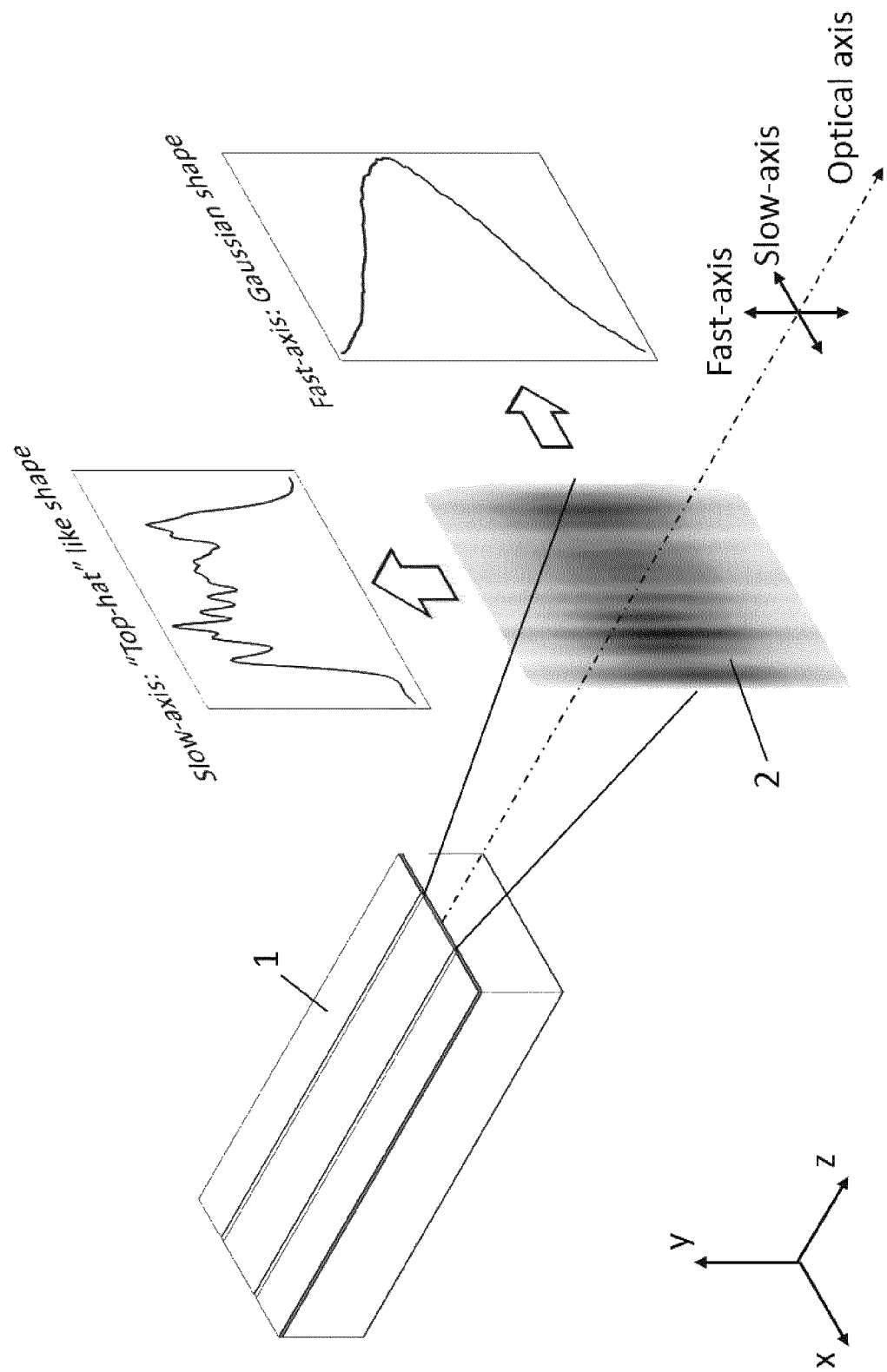
FIG. 1 is a schematic drawing of a typical broad area multimode semiconductor laser diode single emitter and its optical field.

Referring to FIG. 1, a broad area multimode semiconductor laser diode emitter 1 has an optical field 2 that is illustrated with both fast-axis and slow-axis projections. This beam was experimentally recorded at Brolis Semiconductors, Vilnius, Lithuania. The laser diode has a very well defined intensity distribution in the fast axis that is parallel to the growth axis of the diode epitaxial layer structure and a spatially multimode broad beam distribution in the slow axis, perpendicular to a growth axis. In the fast axis, emission is in single mode with a diffraction limited beam resulting in a low beam parameter product [i.e., the product of a laser beam's divergence angle (half-angle) and the radius of the beam at its narrowest point (the beam waist)], as the height of the emission area is defined by the thickness of the epitaxial layers and is typically only one to a few micrometers. In the slow axis, the width of the emitting area is large, e.g., from ten to over hundred micrometers and may contain multiple lateral optical modes. The lateral multimode operation regime may lead to a large beam parameter product Spatial mode distribution in the slow-axis direction is random and leads to an inhomogeneous far-field pattern. For directional laser energy delivery applications such as countermeasures, communication, or illumination, an important feature is the maintenance of a high and uniform radiant intensity level within a certain selected solid angle value. The term "solid angle" describes a two-dimensional angle in three dimensional space. This solid angle may have any shape (circular, rectangular, square, ellipse, etc.). For directional laser energy delivery applications, knowing the radiant intensity within a certain solid angle allows one to calculate and understand beam characteristics (far-field) at any distance from the source.

Figure 2:
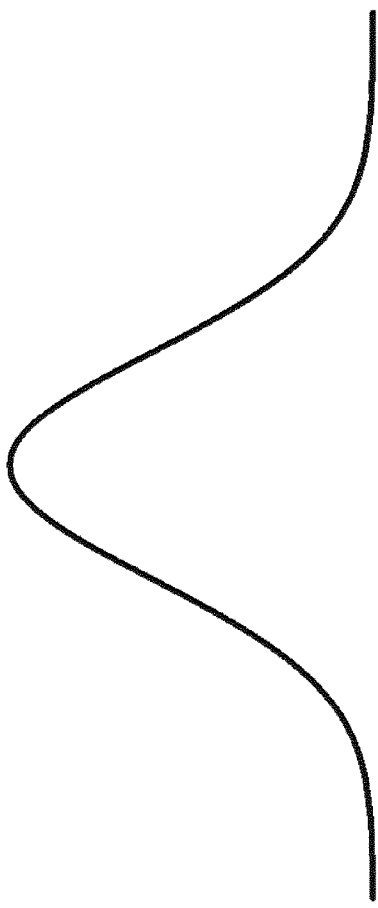
FIG. 2 includes two graphs illustrating a fast-axis Gaussian shape beam profile and a multimode beam profile.
Figure 2:
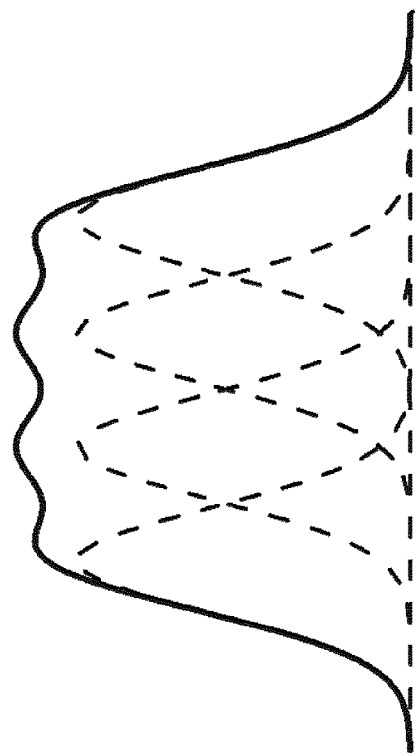

To meet the requirement of maintaining a high and uniform radiant intensity level within a certain selected solid angle, a flat-top or top-hat beam profile is needed that has a very well defined radiant intensity level across the beam and drops sharply at the edges. Ideally, the intensity drop is completely vertical at the beam edges (i.e., rectangular shape); however, this is not a realistic case. While this requirement is known, it is difficult to fulfill in practice for laser diodes, as laser diodes have a Gaussian-like beam in the fast axis. Referring to FIG. 2, a Gaussian shape fast-axis beam profile and a multimode beam profile resulting from multiple Gaussian shapes are illustrated. A Gaussian-like beam has substantial energy in slowly decaying tails of the beam, making it difficult to use the beam for applications requiring high radiant intensity level across a given solid angle. Therefore, in a real case scenario, one would aim to make the intensity slope as steep as possible. In an embodiment of the invention, the edges in the fast-axis direction are of Gaussian shape, with the abruptness of the slope depending on the total emitter count that provides the combined beam—i.e., the more emitters combined, the sharper the edge. The same consideration applies for the slow-axis, except here the sharpness of the edges depends on the spatial mode count per emitter—the more the modes per emitter, the sharper the edges.

In a conventional semiconductor laser module having more than one emitter system, the combination of parallel output beams of several multimode laser diode emitters that have collimated or uncollimated emission results in a radiant intensity profile similar to that of one emitter, i.e., nearly Gaussian shaped.

Figure 3:
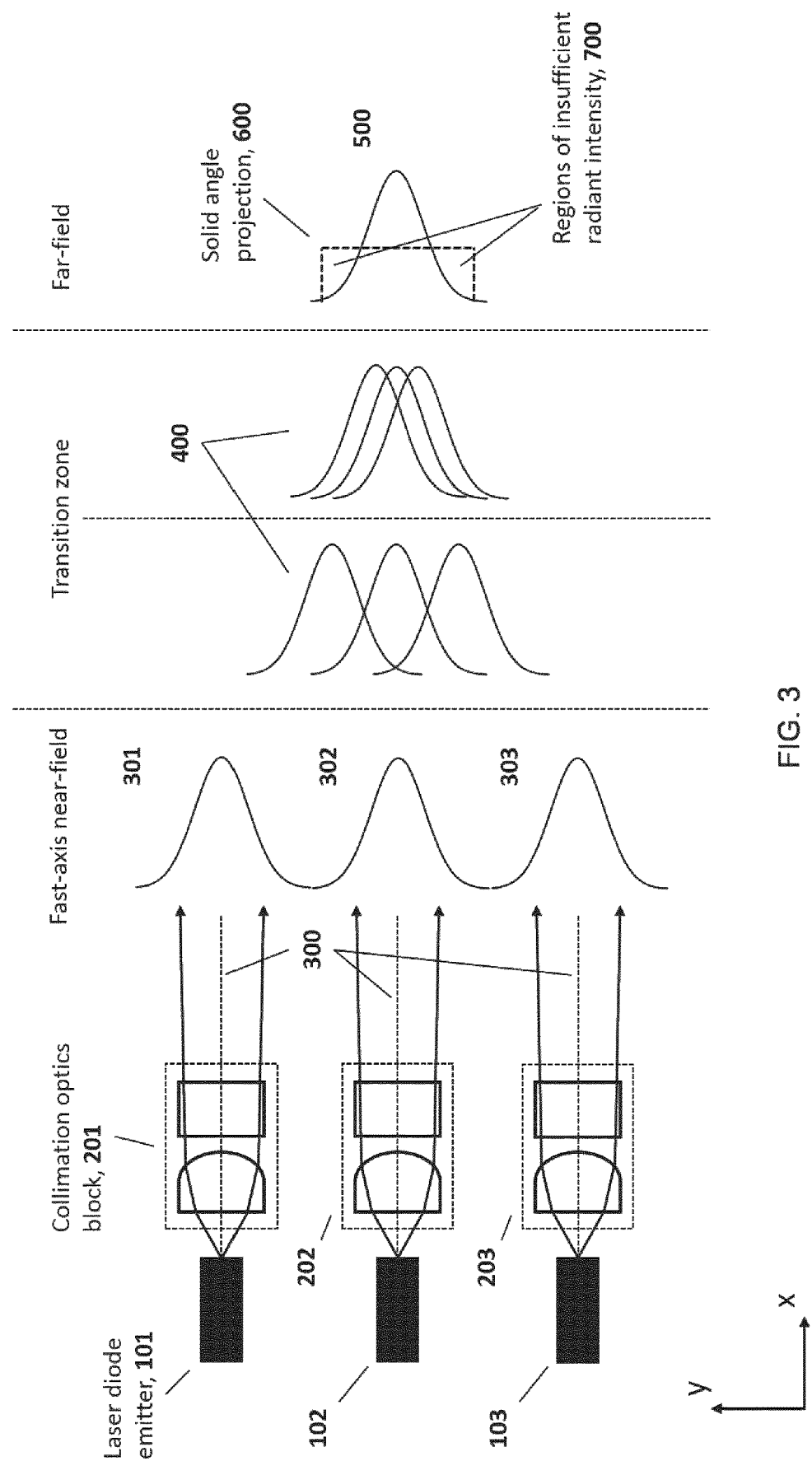
FIG. 3 is a schematic illustration in y-z space of three combined multimode emitters in a conventional system.

Referring to FIG. 3, the combination of three multimode laser diode emitters 101, 102, 103 in y-z space is illustrated. An exemplary multimode emitter is a ridge waveguide semiconductor laser diode based on, e.g., an AlGaInAsSb material system with typical emitter dimensions of 30 microns to 200 microns in width, 2 mm in length and 100 nm to 2000 nm height. A beam from each emitter passes through its respective collimation optic block 201, 202, 203, each of which has an optical axis aligned with the associated laser beam emitter optical axis. Each collimation optic block may include a cylindrical lens, an aspheric lens, an aspheric cylinder lens, a spherical lens, a toroidal lens, and/or a gradient-index lens. The beam propagation axes 300, i.e., the emitter optical axis of each of the three emitters are parallel to each other. The evolution of each beam as it travels from the respective laser diode is shown at the near field 301, 302, 303. As the distance from the emitters increases, the individual beams expand due to finite divergence, and start overlapping 400.

Eventually, the individual beams completely overlap to form a combined beam with a Gaussian fast-axis projection at the far field 500. A dashed rectangle illustrates the 2D projection of the solid angle and a certain radiant intensity level, i.e., the selected solid angle 600. The solid angle and certain radiant intensity level are typically defined by the application, such as DIRCM or free-space communication, and have a 1-10 mrad divergence cone and 10s kW/str of radiant intensity. An objective of the disclosed system is to maintain a uniform and high level of radiation intensity within that cone. It can be seen that, in the case of parallel beams, the combined far-field 500 is Gaussian-like, which does not satisfy the requirement of a uniform radiant intensity 700 within the divergence cone/selected solid angle 600, as it has a high radiant intensity peak at the center and decaying radiant intensity values not meeting the requirement further away from the center due to the nature of Gaussian distribution.

The beam behavior in which a combined beam is formed from three separate beams that completely overlap is typically attained by placing separate emitters within close proximity, i.e., within a few to ten square millimeters. The combination of parallel output beams of such emitters, collimated or uncollimated, at long distances in radiant intensity space typically appears as a single source, as the beams expand due to divergence and the displacement of the overlapped beams is separated by the same few millimeters as the emitters, while the beams are orders of magnitude larger. For example, a beam may be a meter in diameter at a distance of a kilometer. The combined far field has a Gaussian-like shape for the fast-axis projection, maintaining a large portion of the beam energy at the tails. This configuration may be undesirable for directional laser beam delivery applications as these high energy tails (edges of Gaussian distribution) are typically excluded from the solid angle, and a lot of energy is thus wasted at the tails.

Figure 4:
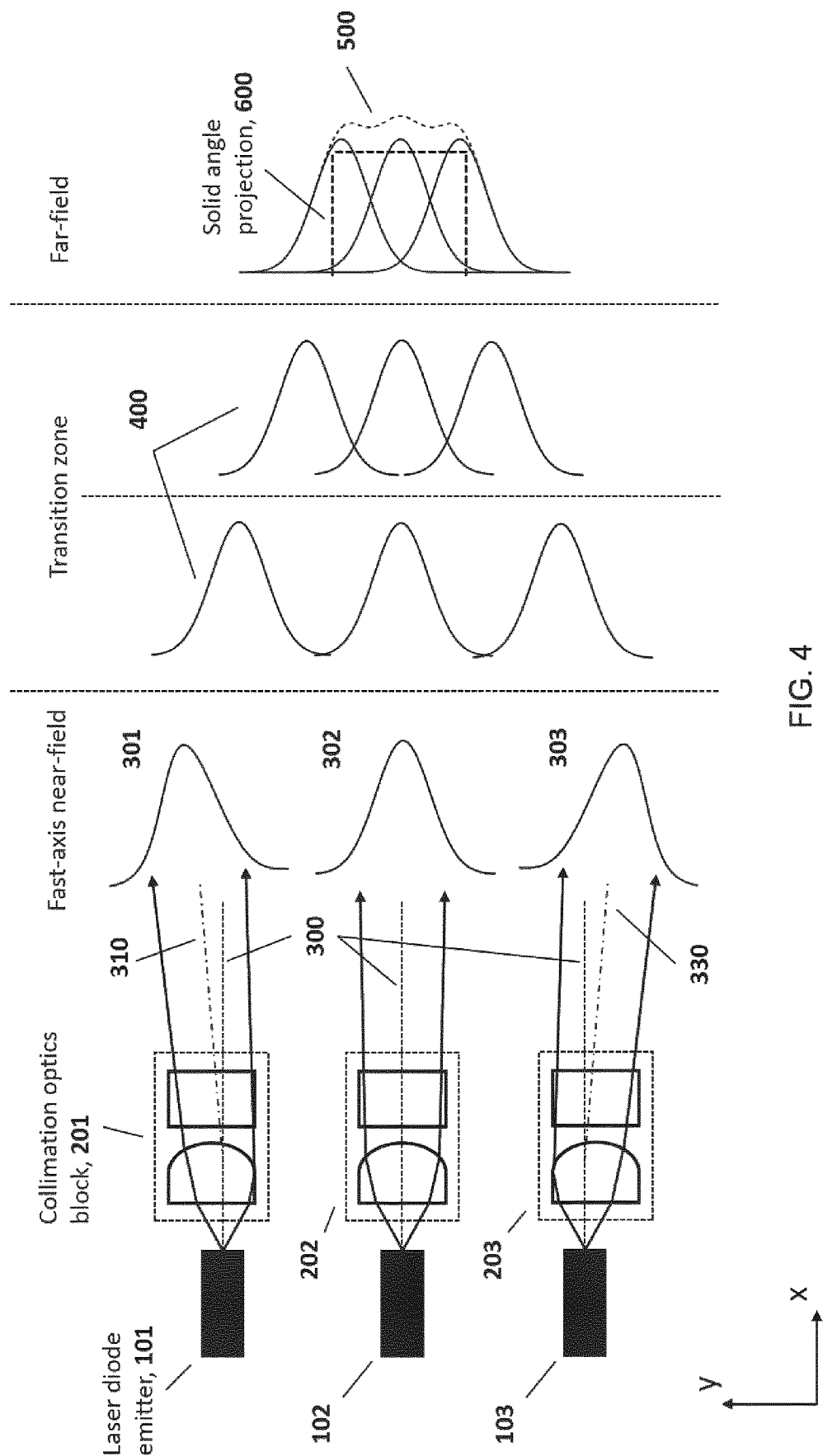
FIG. 4 is a schematic illustration in y-z space of radiant beam combining of three multimode semiconductor lasers with varying beam steering with respect to emitter optical axes, in accordance with an embodiment of the invention.

Referring to FIG. 4, to counter this problem, spatial beam combining of at least two multimode laser beams, in accordance with an embodiment of the invention, includes steering the individual beams, either collimated or uncollimated, to provide a partial overlap. Accordingly, the total radiant intensity of the combined beam is maintained at a homogeneous high-level across a given solid angle. In addition, partial beam overlap allows better mixing of the spatial modes resulting from the multimode beam profile in the slow axis of the broad area laser diode.

Generally, in FIG. 4, the beams are steered to have different angles of propagation with respect to respective system optical axes by offsetting collimating optics blocks (i.e., offset by being moved laterally with respect to the semiconductors lasers). Lateral movement of a collimating optics block provides optical beam tilt.

More specifically, FIG. 3 illustrates in y-z space radiant beam combining of three multimode semiconductor lasers, where the beam of a first emitter 101 is steered upward with respect to a second emitter 102 by offsetting the first collimating optics block 201 upwards along the y-axis direction with respect to the first emitter 101, leading to the beam being steered upwards at a certain angle following new optical axis 310 with respect to an optical axis 300 of the first emitter. The second emitter, i.e., the center emitter 102, and its collimating optics block, i.e., the second optics block 202, have no offset with respect to each other, and thus no beam steering away from the optical axis of the second emitter. The third emitter 103 has its beam steered down by a certain angle following new optical axis 330 with respect to the optical axis 300 of the third emitter. This is achieved by offsetting the collimation optics block 203 a certain distance downwards along the y axis with respect to the third emitter 103 in the y axis. The individual fast-axis beam profiles 301, 302, 303 start to overlap with each other in transition zone 400 due to finite beam divergence, but they never overlap completely because of non-parallel propagation directions and the far field yields a widened, flat-top-like beam, with high radiant intensity level across a large cross-sectional area of the beam 500. The 2D selected solid angle 600 projection with certain radiant intensity level is indicated by a dashed line; the solid angle and certain radiant intensity level are selected in accordance with the needs of the application and are typically 1-10 mrad with $10s$ kW/str of radiant intensity. Individual beam steering allows partial overlap of the beams in order to maintain homogeneous radiant intensity distribution in beam 500 within the selected solid angle 600.

In a particular embodiment, each of the three emitters 101, 102, 103 may be a broad emitter area laterally multimode laser diode. The three emitters may be spaced apart by a distance of typically, but not limited to, e.g., from 0.5 to 3 mm (typically defined by the size of collimating optics block). This distance is usually determined by the size of collimating lenses. The maximum size of optical elements is usually determined by the beam size requirements in near-field, as the beam size preferably fits certain apertures after it exits the laser diode system.

Each of the optics blocks 201, 202, 203 is typically, but not limited to, a system of fast-axis and slow-axis collimating a cylindrical and/or cylindrical lenses (also known as FAC and SAC lenses). The first collimating optics block 201 is offset by typically 1-5 micrometers in the y-axis direction, resulting in the beam from the first emitter 101 being steered upwards at an angle of typically 1-6 mrads. The offset directly depends on the effective focal length of the collimating optics block. In particular, the effective focal length directly determines the required offset distance for a given required steering angle. Required steering angles are determined from the requirements of the system.

The third collimating block 203 is offset by, e.g., 1-5 micrometers in the y-axis direction, resulting in the beam from the third emitter being steered downward at an angle of typically 1-6 mrad. This configuration results in a widened, flat-top-like beam having a full width of 3-18 mrad and an intensity of 10-100 kW/str across a 3-18 m wide cross-sectional area, at the far field at a distance of 1 km from the emitters. Moreover, the angle (divergence) values provided earlier also completely describe the beam's performance, i.e., width of cross-sectional area at any distance.

This configuration may be expanded to multiple laser diodes forming a 1-dimensional or 2-dimensional array with at least partially overlapping beams to provide a combined total beam with a homogeneous high-level radiant intensity distribution across a selected solid angle.

Beam steering of the individual emitter can be performed by offsetting one or all of the elements within the collimation optics assembly or offsetting the laser position with reference to the optical axis of the collimation optics assembly, as is known to one of skill in the art.

Figure 5:
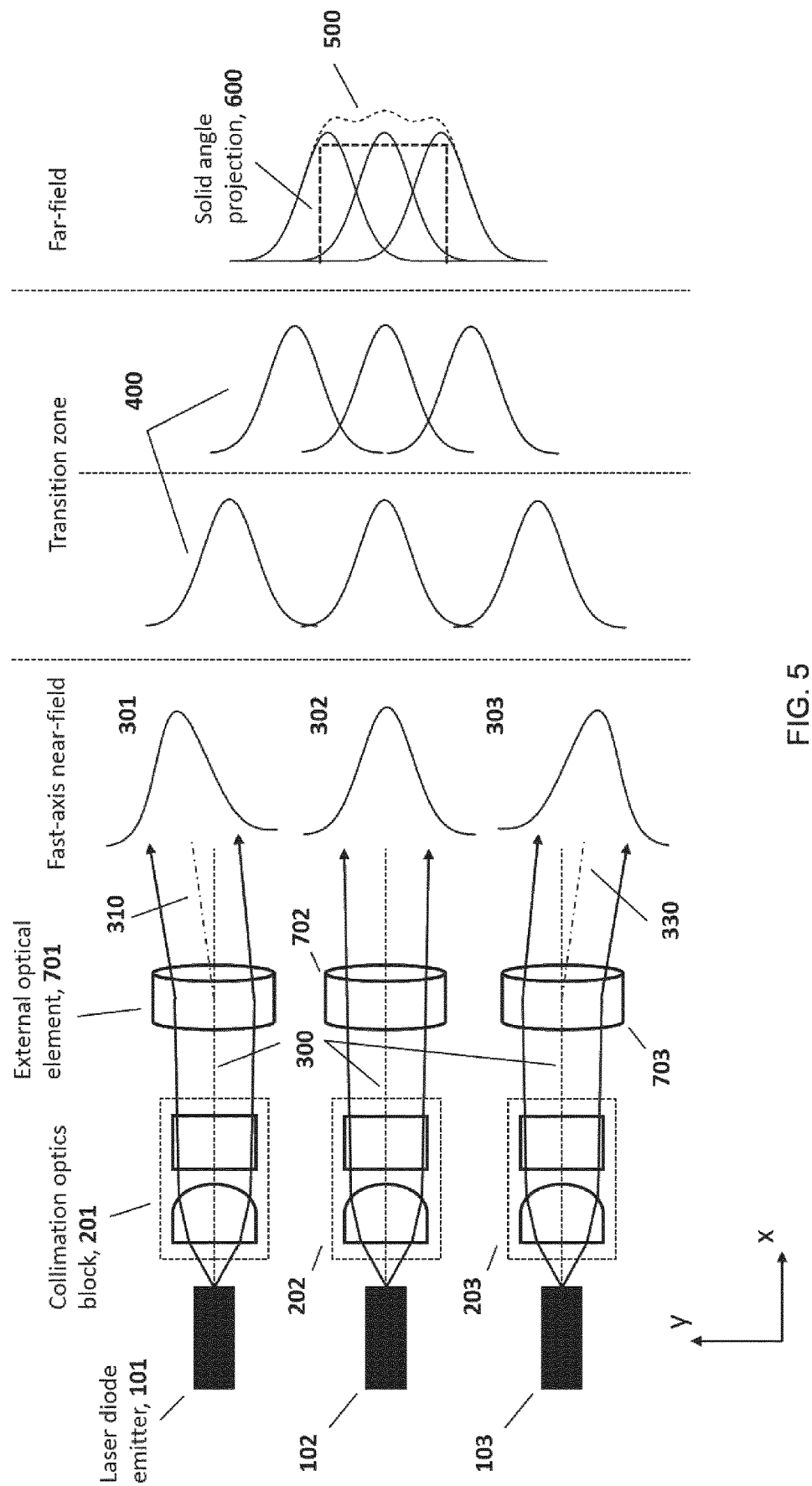
FIG. 5 is a schematic illustration of radiant beam combining of three emitters that have no offset with reference to the collimating optics blocks and the radiant beam combining is performed by external optical blocks, in accordance with an embodiment of the invention.

Referring to FIG. 5, alternatively, beam steering may be performed with external optical elements such as mirrors, dichroic mirrors, beam splitters, and/or optical wedges when the laser diodes and their respective collimating optic blocks are fixed. For example, radiant beam combining may be performed with first, second, and third emitters 101, 102, 103 that have no offset with respect to their respective first, second, and third collimating optics blocks 201, 202, 203. The radiant beam combining is performed by external optical blocks 701, 702, 703 that can be, e.g., optical mirrors, optical prisms, optical wedge pairs, optical beam splitters, and/or optical dichroic mirrors. As in FIG. 4, in this configuration the individual fast-axis beam profiles 301, 302, 303 start to overlap with each other in transition zone 400 due to finite beam divergence finally resulting in a beam 500 with desirable flat-top-like fast-axis projection with high radiant intensity level across a large cross section area of the beam completely covering required radiant intensity level within selected solid angle 600.

Figure 6:
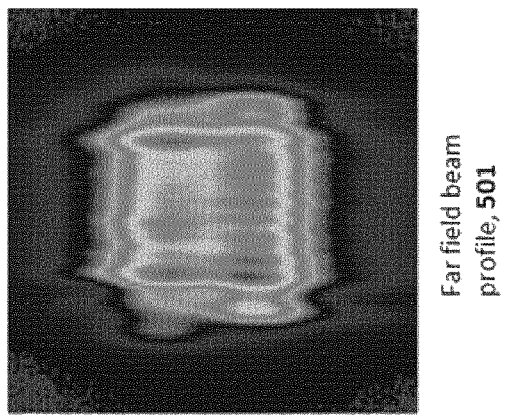
FIG. 6 is a detailed schematic illustration of top and side views of a compact laser module using radiant beam combining of two emitters, in which the beam is varied with respect to each emitter optical axis, in accordance with an embodiment of the invention.
Figure 6:
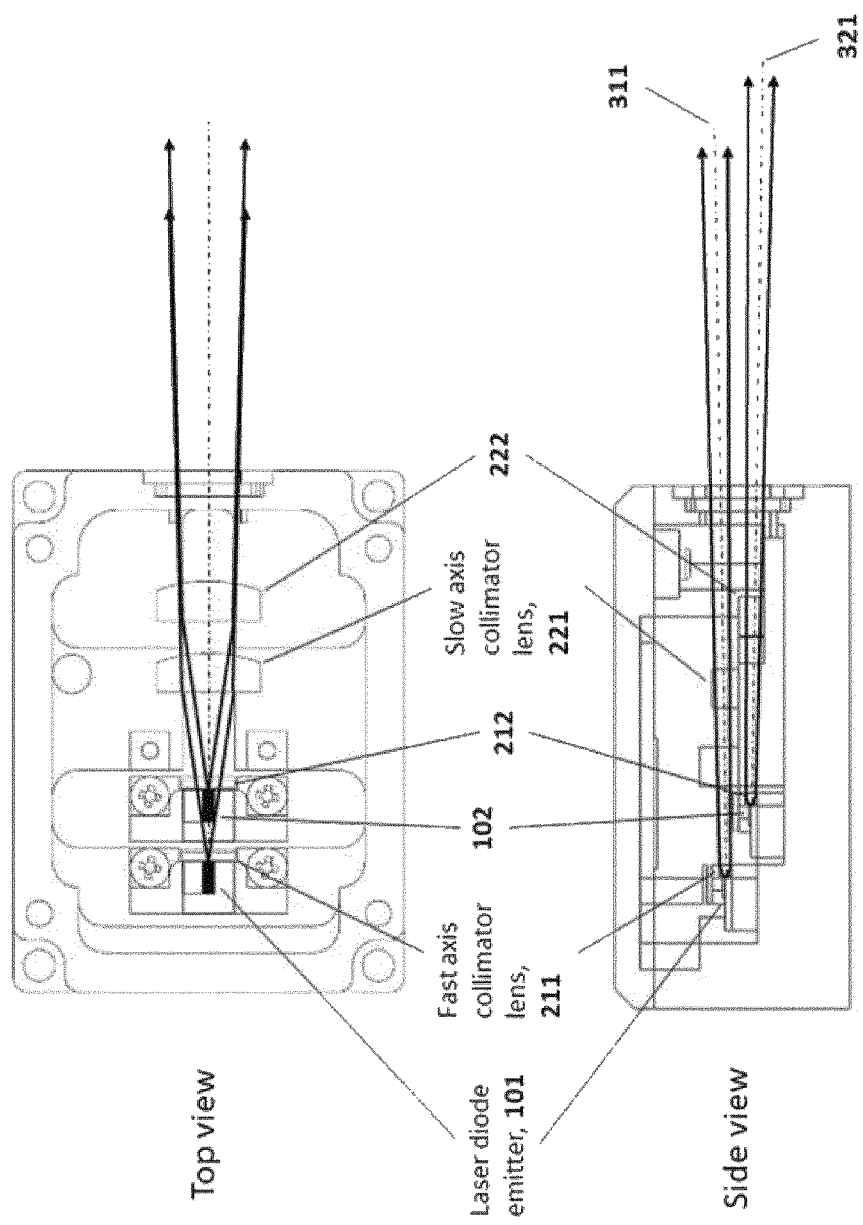

A particular example of a very compact laser module, utilizing radiant beam combining technique of two broad area multimode semiconductor laser emitters is depicted in FIG. 6 and FIG. 7a-7c. Referring to FIG. 6, the laser module may include two multimode broad area laser emitters 101, 102, which in the illustrated embodiment are positioned on a staircase-like base, defining a vertical array. The laser module may include more than two laser emitters, and the laser emitters may be arranged in other configurations, e.g., emitters can be placed side by side to form a linear array, with their respective beams being steered to a desired far field location using the fast-axis and slow-axis collimator optics blocks. Generally, the semiconductor laser emitters can be arranged to form a 2D array with their beams steered to a desired output, at least partially overlapping, to form a radiantly combined beam. Such a 2D array may also contain laser emitters emitting at different spectral bands, with the respective groups of emitters being radiantly combined, at least partially overlapping, to form a non-Gaussian type beam at the desired output location. The outputs of each assembly may then be directed to a single system output as described with respect to FIG. 8.

The beam of each emitter is individually collimated using fast axis collimator lenses 211, 212 and slow-axis collimator lenses 221, 222. Fast-axis output beam profiles 301, 302 of the two emitters are individually steered by offsetting the fast-axis collimator lenses 211, 212 to form a radiantly combined beam in the far-field 501.

Figure 7A:
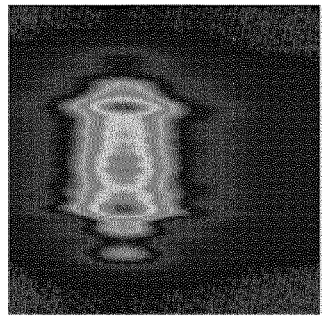
FIGS. 7a-7c are detailed illustration of radiant beam combining, illustrating individual emitter beams that are offset with respect to emitter optical axes and also the radiantly combined beam of two lasers according to an embodiment of the invention.
Figure 7B:
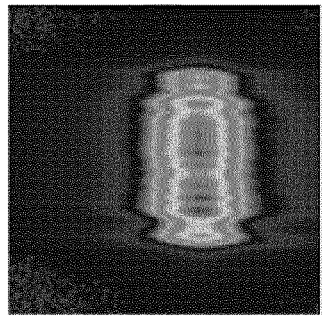
Figure 7C:
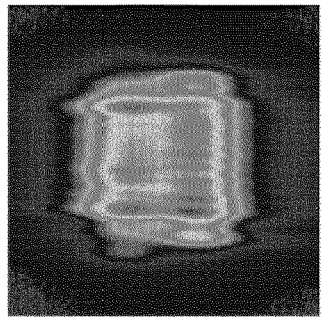

This procedure is further presented in step-by-step detail in FIG. 7a-7c, with high-power broad area multimode laser diodes based on a III-V material system, in particular, a GaSb/AlGaInAsSb material system. In an embodiment, the lasers have a cavity length of 1.5 mm and emitter width of 0.12 mm. In other embodiments, the cavity length may range from several hundred microns to several millimeters, in some cases even 10 millimeters. The emitter width may be range from 1 micron to several hundred microns depending on the emission wavelength and epitaxial structure design.

The main criteria for selecting the cavity dimensions are primarily performance based, i.e., the emitter preferably emits sufficient output power for the application, and the output beam preferably contains a sufficient amount of spatial modes to ensure a random and spatial hole free far field.

Accordingly, a semiconductor laser diode emitting in ultra-violet spectral region having an emitter width of 5 microns contains similar amount of lateral modes (multi-mode emission in the slow-axis) as a 120 micron wide emitter emitting in the mid-infrared. The cavity length is preferably selected to allow sufficient output power for the relevant application. The cavity length also defines the power consumption of the chip as well final cost per chip. In particular, the smaller the chip, the more chips can be produced on a single wafer and thus cost per chip can be lowered. For example, a single 3-inch GaSb epi-wafer can host up to about 6000 1.5 mm×0.12 mm lasers. Increasing the cavity length to 2 mm from 1.5 mm lowers the yield per wafer to only about 3600 lasers, thereby raising the chip cost by more than 60%. Therefore, it may be desirable to achieve performance requirements with the smallest footprint possible.

A single emitter is typically capable of >1 W of CW power with electrical-optical (E-O) efficiency of 10-30% emitting in the spectral band between 2.1 μm-2.3 μm, i.e., the atmospheric transmission window typically covered using either a solid-state laser or fiber laser technology FIG. 7a illustrates the beam of the first broad area multimode emitter 101, with a beam steered upwards by means of the fast-axis collimator lens 211 which is offset by 1.5 μm upwards, passing through a slow-axis collimator lens 221. In some embodiments, the fast-axis collimator lens 211 may be offset by a distance selected from a range of 1-5 μm. The exact distance to be offset depends on the system design requirements, lens parameters, and the laser diode beam parameters. The required amount of offset distance can be calculated using the following mathematical relation:

Offset_distance[μm]=lens_effective_focal_length[μm]
*tan(required_steering_angle[rad]).

In an embodiment, the fast-axis collimator lens has a 0.6 mm effective focal length and a numerical aperture (NA) of 0.8, and the slow-axis collimator lens has a 15 mm effective focal length and 0.14 NA. The resulting beam has a new optical axis 310, and a resulting experimental 2D far field beam profile 510. In other embodiments, the fast-axis collimator lens may have an effective focal length selected from a range of 0.05 micron to 100 mm, and NA selected from a range of 0.1 to 1. The slow-axis collimator lens may have an effective focal length selected from a range of 0.05 micron to 100 mm, and NA selected from a range of 0.1 to 1. The main criteria for selecting the fast-axis and slow-axis collimators are semiconductor laser beam parameters, final system design requirements, and mechanical requirements specifications.

FIG. 7b depicts the beam of the second multimode broad area emitter 102, with a beam steered downwards by the fast-axis optical collimator 212 which is offset by downward by the same amount that the first broad area multimode emitter 101 is offset upwards, e.g., 1.5 μm downwards. The beam then passes through the slow-axis collimator optics 222 with a new optical axis 320 and a respective 2D beam profile 511.

FIG. 7c illustrates the radiant beam combining of both emitters 101, 102 with a resulting radiantly combined 2D beam profile 501, which has the advantage of maintaining a large radiant intensity value across a large solid angle—in this particular embodiment approximately 8 mrad×8 mrad. In various embodiments, the solid angle may range from, e.g., 1 mrad×1 mrad to 10 mrad×10 mrad.

This arrangement of emitters provides numerous advantages. First of all, it allows leveraging otherwise poor beam quality of the multimode emitter and utilizing the much higher output power available compared to the single mode emitter. Secondly, radiant beam combining provides a large "top-hat" beam profile with a high radiant intensity which is less sensitive to beam wandering due to temperature and other environmental effects. For example, if the application requirement is to maintain a 10 kW/sr beam within a 5 mrad divergence cone, and the laser assembly, constructed as the embodiment in FIGS. 7a-7c, delivers >10 kW/sr within a 8 mrad×8 mrad cone, the beam pointing accuracy can be relaxed to as much as 1.5 mrad and still fulfill the application requirements. In other words, a maximum 1.5 mrad pointing error from the center of the 8 mrad×8 mrad beam still allows having a 5 mrad divergence cone maintaining the radiant intensity requirement. This is possible because radiant beam combining may be used to provide a larger area with high radiant intensity, and thus the system can accommodate beam wandering to a certain extent. This is an important advantage compared to the much more sensitive standard Gaussian-like beam output, which allows one to operate the system in a wide temperature range and other varying environmental conditions, as is often the case for airborne applications.

Finally, radiant beam combining of multimode semiconductor lasers allows the realization of ultra-compact assemblies. For example, a two-emitter based module using radiant beam combining can be as small as 25 mm×40 mm×15 mm and have a weight <30 g. This is a significant size, weight, and power (SWaP) gain compared to any other solid state-laser technology.

The radiant beam combining technique disclosed herein can be realized using different lasers, for example GaAs-based emitting around 1 micron or AlGaInAs/GaInAs/InP based quantum cascade lasers emitting in the 3-5 micron and 8-10 micron spectral regions or GaN/AlGaInN based lasers emitting in the UV spectral band.

Furthermore, the disclosed radiant beam combining technique can be extended independently of the spectral region and applied to fabricating compact multi-spectral laser beam delivery systems using simple, robust and cheap broad area multimode emitters emitting in, e.g., ultraviolet, visible, near-infrared, short-wave infrared, mid-wave infrared, and/or long-wave infrared.

Figure 8:
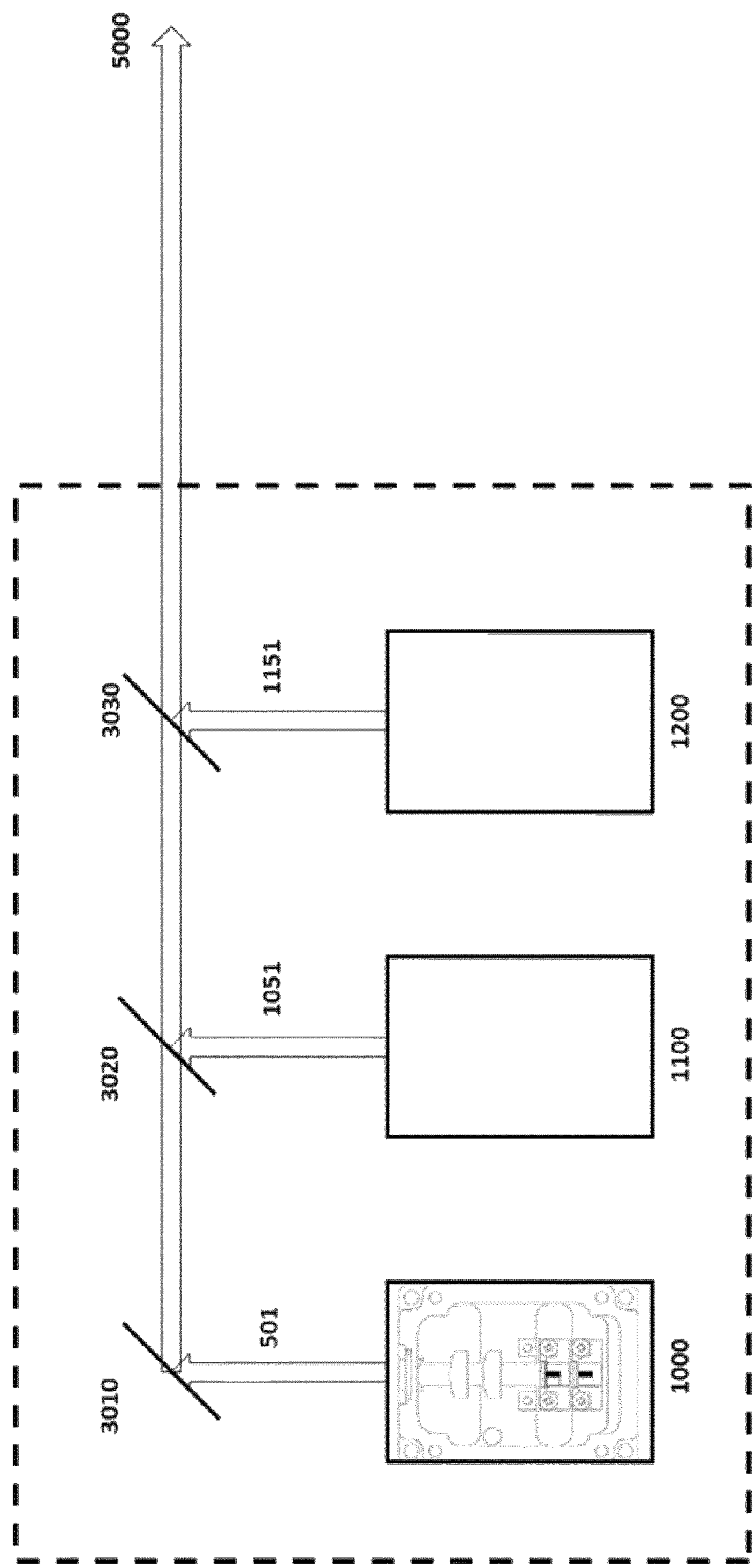
FIG. 8 is a schematic block diagram of a multi-spectral laser system for long-distance beam delivery applications, such as DIRCM. Each block includes a laser module in a distinct and different spectral region, with at least two emitters radiantly combined to provide a high-radiant intensity beam across a defined solid angle.

A simple block diagram of a multi-spectral laser beam delivery system 2000 is shown in FIG. 8, in which individual laser modules 1000, 1100, 1200 are each dedicated to a particular spectral region of interest, e.g., ultraviolet, visible, near-infrared, short-wave infrared, mid-wave infrared, or long-wave infrared. The exemplary illustrated system embodiment includes three laser modules, but a system may include as many laser modules as desired for a particular application. For example, first laser module 1000 may be dedicated to near-infrared spectral region and emit around 1 micron wavelength, second laser module 1100 dedicated to ultra-violet spectral range and emit around 300-400 nm, third laser module 1200 dedicated to short-wave infrared spectral region and emit at 2100 nm, fourth module (not shown) dedicated to mid-wave infrared and emit around 4000 nm, and so on until the full 300 nm-10 000 nm spectral band is covered in the multi-spectral laser beam delivery system output.

Each of the modules provides a radiantly combined output beam 501, 1051, 1151. These beams are further combined by means of optical elements such as dichroic mirrors 3010, 3020, 3030 to provide a multispectral laser beam 5000 at an output of the system. The output beam contains combined multi-spectral output beams of different laser subassemblies within the system, e.g., the system may emit optical radiation with a jamming pattern within all the spectral bands of interest such as ultra-violet, near-infrared, short-wave infrared, mid-wave-infrared and long-wave infrared, thereby being able to fully mitigate the thermal signature of the airborne platform in the entire spectral region.

Such a system is especially suited for jamming a heat-seeking missile, as it provides a very wide multi-spectral jamming signal with very high brightness and directionality, e.g., 1 kW/sr to multiple 100 kW/sr radiant intensity for a 1 mrad to 10 mrad divergence cone. Each of the different spectral channels can be modulated independently to provide a complex jam signal making it impossible to countermeasure. Similarly, such a multi-spectral laser beam delivery system can be used for covert free-space communication applications utilizing the immense bandwidth and the ability to change the channels within the bandwidth. Due to the fact that a system in accordance with embodiments of the invention may be constructed to emit in the entire 300 nm-10 000 nm spectral region, the ability to encode information within such an immense bandwidth and the ability to switch between a multitude of channels would make it extremely difficult if not impossible for the counterparty to successfully jam and intercept the signal.

The described embodiments of the invention are intended to be merely exemplary and numerous variations and modifications will be apparent to those skilled in the art. All such variations and modifications are intended to be within the scope of the present invention as defined in the appended claims.

The invention claimed is:

1. A method of combining a plurality of multimode laser beams in radiant space, comprising the steps of:
   emitting a plurality of individual laser beams, comprising a first individual laser beam and one or more other individual laser beams, wherein each individual laser beam of the plurality of individual laser beams is emitted from a respective emitter in a plurality of emitters, each individual laser beam being a multimode laser beam having a respective fast axis and a Gaussian profile along the respective fast axis;
   steering the first individual laser beam along the fast axis thereof, to obtain a first steered individual multimode Gaussian-profile laser beam; and
   combining the first steered individual multimode Gaussian-profile laser beam with at least one of the one or more other individual laser beams, by partially overlapping the first steered individual multimode Gaussian-profile laser beam and the at least one of the one or more other individual laser beams while maintaining the Gaussian profiles thereof to form a combined beam with a homogeneous non-Gaussian radiant intensity distribution across a selected solid angle.

2. The method of claim 1, where each laser beam emitter comprises a broad area semiconductor laser with a multimode beam output.

3. The method of claim 1, wherein the laser beam emitters are spatially separated from each other to define at least one of a one-dimensional array or a two-dimensional array.

4. The method of claim 1, further comprising providing individual beam collimation optics for each laser beam emitter.

5. The method of claim 4, wherein the collimation optics comprise at least one of a cylindrical lens, an aspheric lens, an aspheric cylinder lens, a spherical lens, a toroidal lens, a gradient-index lens, or a combination thereof.

6. The method of claim 4, wherein the collimation optics are at least one of discrete, arranged in a monolithic one-dimensional array, or arranged in a two-dimensional array.

7. The method of claim 4, wherein (i) the laser beam emitter comprises a laser diode, and (ii) steering the individual multimode laser beam from the emitter comprises steering the beam at a desired angle in radiant space by individually offsetting a position of the respective collimation optics with reference to an output plane of the laser diode.

8. The method of claim 4, wherein (i) the laser beam emitter comprises a laser diode, and (ii) steering the individual multimode laser beam from the emitter comprises offsetting a position of the laser diode with respect to an optical axis of the respective beam collimation optics.

9. The method of claim 4, wherein (i) the laser beam emitter comprises a laser diode, and (ii) beam combining is performed without any offset between the laser diode and the respective collimation optics, and (iii) beam steering is performed by steering the laser diode and the respective collimation optics.

10. The method of claim 4, wherein steering the individual laser beam comprises using an external optical element.

11. The method of claim 10, wherein the external optical element is selected from the group consisting of optical mirrors, optical prisms, optical wedge pairs, optical beam splitters, optical dichroic mirrors, and combinations thereof.

12. A laser-based assembly for combining a plurality of multimode laser beams in radiant space, comprising:
   a plurality of laser beam emitters; and
   a plurality of individual beam collimation optics, with one individual beam collimation optics being associated with each emitter,
   wherein the laser beam emitters and collimation optics are spaced and arranged such that, in use,
      each emitter emits a respective individual laser beam in a plurality of individual laser beams comprising a first individual laser beam and one or more other individual laser beams, each individual laser beam being a multimode laser beam having a respective fast axis and a Gaussian profile along the respective fast axis,
      the first individual laser beam is steered along the fast axis thereof, to obtain a first steered individual multimode Gaussian-profile laser beam, and
      the first steered individual multimode Gaussian-profile laser beam is combined with at least one of the one or more other individual laser beams by partially overlapping the first steered individual multimode Gaussian-profile laser beam and the at least one of the one or more other individual laser beams while maintaining the Gaussian profiles thereof to form a combined beam with a homogeneous non-Gaussian radiant intensity distribution across a selected solid angle.

13. The laser-based assembly of claim 12, where each laser beam emitter comprises a broad area semiconductor laser with a multimode beam output.

14. The laser-based assembly of claim 12, wherein individual pairs of laser beam emitters and the respective collimation optics are spatially separated to define at least one of a one-dimensional array or a two-dimensional array.

15. The laser-based assembly of claim 12, wherein the collimation optics comprise at least one of a cylindrical lens, an aspheric lens, an aspheric cylinder lens, a spherical lens, a toroidal, a gradient-index lens, or a combination thereof.

16. The laser-based assembly of claim 12, wherein (i) each laser beam emitter comprises a laser diode, and (ii) in use, the individual multimode laser beams from the emitters are each steered at a desired angle in radiant space by individually offsetting a position of the individual beam collimation optics with reference to an output plane of the laser diode of the associated laser beam emitter.

17. The laser-based assembly of claim 12, wherein (i) each laser beam emitter comprises a laser diode, and (ii) the individual multimode laser beam from the emitters are each steered by offsetting a position of the laser diode with respect to an optical axis of the respective beam collimation optics.

18. The laser-based assembly of claim 12, wherein individual pairs of laser beam emitters and the respective collimation optics are adapted and arranged to be steered to form the combined beam.

19. The laser-based assembly of claim 12, further comprising:
a plurality of external optical elements spaced and arranged to steer the individual laser beams.

20. The laser-based assembly of claim 19, wherein the external optical elements are selected from the group consisting of optical mirrors, optical prisms, optical wedge pairs, optical beam splitters, optical dichroic mirrors, and combinations thereof.

21. A multi-spectral laser beam delivery system comprising:
at least two laser modules, each laser module comprising a laser-based assembly for combining a plurality of multimode laser beams in radiant space, comprising:
a plurality of laser beam emitters; and
a plurality of individual beam collimation optics, with one individual beam collimation optics being associated with each emitter,
wherein (i) the laser beam emitters and collimation optics are spaced and arranged such that, in use,
each emitter emits a respective individual laser beam in a plurality of individual laser beams comprising a first individual laser beam and one or more other individual laser beams, each individual laser beam being a multimode laser beam having a respective fast axis and a Gaussian profile along the respective fast axis,
the first individual laser beam is steered along the fast axis thereof, to obtain a first steered individual multimode Gaussian-profile laser beam, and
the first steered individual multimode Gaussian-profile laser beam is combined with at least one of the one or more other individual laser beams by partially overlapping the first steered individual multimode Gaussian-profile laser beam and the at least one of the one or more other individual laser beams while maintaining the Gaussian profiles thereof to form a combined beam with a homogeneous non-Gaussian radiant intensity distribution across a selected solid angle, and
(ii) each of the laser modules emits at a different spectral region selected from the group consisting of ultraviolet, infrared, near-infrared, short-wave infrared, mid-infrared and long-wave infrared, to provide a multispectral, radiantly combined laser beam at an output of the system.

* * * * *